United States Patent
Tsai et al.

(10) Patent No.: US 8,592,234 B2
(45) Date of Patent: Nov. 26, 2013

(54) METHOD FOR MANUFACTURING A LED

(75) Inventors: Chang-Da Tsai, Hsinchu (TW);
Wei-Che Wu, Hsinchu (TW);
Chia-Liang Hsu, Hsinchu (TW);
Ching-Shih Ma, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 13/594,948

(22) Filed: Aug. 27, 2012

(65) Prior Publication Data

US 2012/0322180 A1 Dec. 20, 2012

Related U.S. Application Data

(60) Division of application No. 12/629,030, filed on Dec. 1, 2009, now Pat. No. 8,283,683, which is a continuation-in-part of application No. 11/749,139, filed on May 15, 2007, now abandoned.

(30) Foreign Application Priority Data

Nov. 7, 2006 (TW) ................ 95141205 A

(51) Int. Cl.
*H01L 21/00* (2006.01)
(52) U.S. Cl.
USPC ............. 438/28; 438/27; 438/29; 257/E33.06
(58) Field of Classification Search
USPC .................... 438/28, 68, 455, 458, 27, 29; 257/E33.06
See application file for complete search history.

(56) References Cited

U.S. PATENT DOCUMENTS

| | | | |
|---|---|---|---|
| 5,502,316 | A | 3/1996 | Kish et al. |
| 6,221,683 | B1 | 4/2001 | Nirschl et al. |
| 6,258,699 | B1 | 7/2001 | Chang et al. |
| 6,559,379 | B2 | 5/2003 | Solanki et al. |
| 6,653,661 | B2 | 11/2003 | Okazaki |
| 6,687,268 | B2 | 2/2004 | Kitamura et al. |
| 6,967,117 | B2 | 11/2005 | Horng et al. |

(Continued)

FOREIGN PATENT DOCUMENTS

| | | |
|---|---|---|
| JP | 53-139990 | 12/1978 |
| JP | 55-070080 | 5/1980 |

(Continued)

OTHER PUBLICATIONS

Japan Patent Office, "Office Action", Sep. 20, 2011, Japan.

*Primary Examiner* — Kimberly Rizkallah
*Assistant Examiner* — Duy T Nguyen
(74) *Attorney, Agent, or Firm* — WPAT, PC; Justin King

(57) ABSTRACT

A light emitting diode comprises a permanent substrate having a chip holding space formed on a first surface of the permanent substrate; an insulating layer and a metal layer sequentially formed on the first surface of the permanent substrate and the chip holding space, wherein the metal layer comprises a first area and a second area not being contacted to each other; a chip having a first surface attached on a bottom of the chip holding space, contacted to the first area of the metal layer; a filler structure filled between the chip holding space and the chip; and a first electrode formed on a second surface of the chip. The chip comprises a light-emitting region and an electrical connection between the first area of the metal layer and the light emitting region is realized by using a chip-bonding technology.

6 Claims, 18 Drawing Sheets

(56) References Cited

U.S. PATENT DOCUMENTS

| | | |
|---|---|---|
| 7,253,735 B2 | 8/2007 | Gengel et al. |
| 7,256,483 B2 | 8/2007 | Epler et al. |
| 2002/0063256 A1 | 5/2002 | Lin |
| 2002/0121644 A1 | 9/2002 | Ueda |
| 2002/0137245 A1* | 9/2002 | Kitamura et al. ............ 438/22 |
| 2004/0036081 A1 | 2/2004 | Okazaki |
| 2004/0104395 A1* | 6/2004 | Hagimoto et al. ............ 257/79 |
| 2005/0142677 A1 | 6/2005 | Kon et al. |
| 2005/0194599 A1 | 9/2005 | Tanaka |
| 2006/0001055 A1 | 1/2006 | Ueno et al. |
| 2006/0006405 A1 | 1/2006 | Mazzochette |
| 2006/0043407 A1 | 3/2006 | Okazaki |
| 2006/0057752 A1 | 3/2006 | Yang |
| 2006/0060877 A1* | 3/2006 | Edmond et al. ............ 257/99 |
| 2006/0091409 A1 | 5/2006 | Epler et al. |
| 2006/0192211 A1* | 8/2006 | Kako et al. ............ 257/79 |
| 2006/0240585 A1 | 10/2006 | Epler et al. |
| 2007/0152309 A1 | 7/2007 | Cheng |
| 2008/0035942 A1* | 2/2008 | Kim et al. ............ 257/98 |

FOREIGN PATENT DOCUMENTS

| | | |
|---|---|---|
| JP | 04-211182 | 8/1992 |
| JP | 10-098215 | 4/1998 |
| JP | 2005-050871 | 2/2005 |
| JP | 2005044849 | 2/2005 |
| JP | 2005-129799 | 5/2005 |
| JP | 2005277280 | 10/2005 |
| JP | 2006128710 | 5/2006 |
| TW | 369731 | 9/1999 |
| WO | 2005008793 | 1/2005 |

* cited by examiner

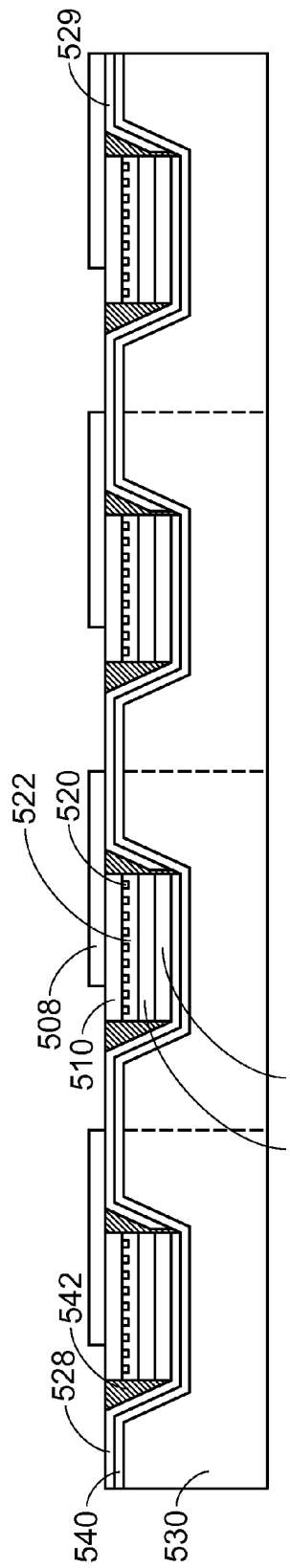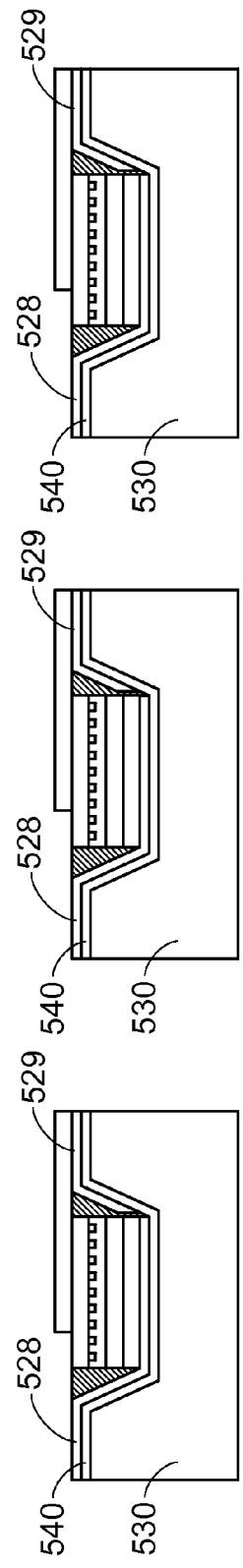

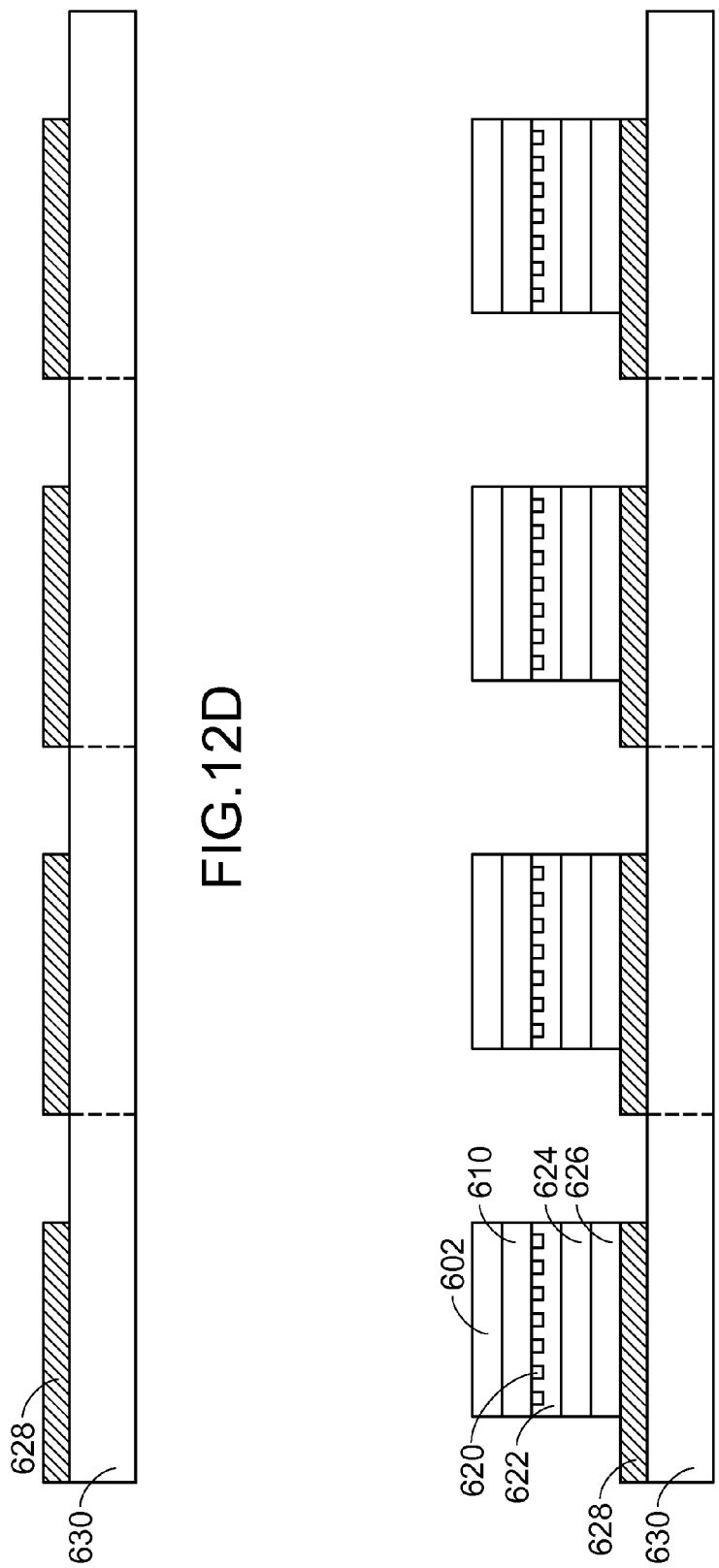

METHOD FOR MANUFACTURING A LED

This application is a divisional application of U.S. application Ser. No. 12/629,030, filed Dec. 1, 200, U.S. Pat. No. 8,283,683, which is a continuation-in-part application of U.S. application Ser. No. 11/749,139, filed May 15, 2007, abandoned, which claims benefit of Taiwan Patent Application No. 095141205, filed Nov. 02, 2006. The contents of which are incorporated herein by reference.

FIELD OF THE INVENTION

The present invention relates to a light emitting diode (LED) and a manufacturing method of the LED, and more particularly to a chip-bonding LED and a manufacturing method of the chip-bonding LED.

BACKGROUND OF THE INVENTION

LEDs are employed in a wide variety of applications. For example, in optical data transmission, LEDs are used to launch data signal alone a fiber-optic cable.

FIG. 1 depicts a prior-art AlGaInP quaternary LED. In the AlGaInP quaternary LED 100, a light-emitting region 110 is grown on the surface of an n-doped GaAs substrate 102. The light-emitting region 110 includes an n-doped AlGaInP layer 103, an AlGaInP active layer 104, a p-doped AlGaInP layer 105, and a p-doped GaP layer 106 arranged in the listed order. Moreover, a first electrode 108 is formed on the surface of the p-doped GaP layer 106 and a second electrode 109 is formed on the surface of the n-doped GaAs substrate 102. Typically, the AlGaInP active layer 104 is a double-heterostructure active layer or a quantum-well active layer.

Because the energy gap of the GaAs substrate 102 is less than the emission energy of the AlGaInP active layer 104, the GaAs substrate 102 will absorb some of the light generated within the AlGaInP active layer 104, thereby reducing the efficiency of the LED 100.

Improved performance can be achieved by employing an optically-transparent substrate instead of the n-doped GaAs substrate. The method is disclosed by the U.S. Pat. No. 5,502,316. Firstly, the removal of the n-doped GaAs substrate 102 is prior the formation of the electrodes. Next, an optically-transparent substrate 122 (e.g., n-doped GaP substrate, glass substrate, or quartz substrate) is bonded to the light-emitting region 110 at a relatively high temperature (e.g., 800~1000□) utilizing a wafer-bonding technique. FIG. 2 depicts a LED 120 having an optically-transparent substrate 122 (e.g., n-doped GaP substrate), and the optically-transparent substrate 122 is electrically conductive. In the LED 120, the first electrode 108 is formed on the surface of the p-doped GaP layer 106 and a second electrode 111 is formed partially on the surface of the n-doped GaP substrate 122. Because the light generated in the AlGaInP active layer 104 can travel through the optically-transparent substrate 122, thereby enhancing the performance of the LED 120.

FIGS. 3A to 3F depict the steps of manufacturing a LED utilizing the prior-art wafer-bonding technique. In FIG. 3A, a single large-size substrate 102 is provided for the EPI process, wherein the substrate 102 is an n-doped GaAs substrate, also referred as a temporary substrate. In FIG. 3B, a light-emitting region 110 is formed on the surface of the substrate 102. In FIG. 3C, the temporary substrate 102 is removed and only the light-emitting region 110 is left. In FIG. 3D, a large-size permanent substrate 122 (e.g., optically-transparent substrate) is provided and wafer bonded to the light-emitting region 110 at a relatively high temperature. In FIG. 3E, a plurality of first electrodes 108 and a plurality of second electrodes 111 are formed on the surface of the light-emitting region 110 and the surface of the permanent substrate 122, respectively. At last, as depicted in FIG. 3F, a plurality of LEDs are manufactured after cutting the structure of FIG. 3E.

It is well understood that semiconductor material is easily to degrade at a relatively high temperature. Unfortunately, the wafer-bonding technique is necessarily processed at a relatively high temperature, and the relatively high temperature may degrade the light-emitting region 110. Moreover, because the sizes of the light-emitting region 110 and the permanent substrate 122 are relatively large, any uneven or particles adhered to the surfaces of the light-emitting region 110 or the permanent substrate 122 may fail the wafer-bonding step. Moreover, because the permanent substrate 122 is wafer bonded after the removal of the temporary substrate 102, the light-emitting region 110 would be unsupported by a substrate and will be difficult to handle without breaking.

Another method for fixing the light-absorbing problem in the substrate is disclosed by the U.S. Pat. No. 6,967,117 which adopts a reflecting layer for reflecting the light out the substrate. As depicted in FIG. 4A, a light-emitting region 110 is formed on the surface of a temporary substrate 102 (e.g., n-doped GaAs substrate), and the light-emitting region 110 sequentially includes an n-doped AlGaInP layer 103, an AlGaInP active layer 104, a p-doped AlGaInP layer 105, and a p-doped GaP layer 106. In addition, a buffer layer 145 and a reflecting layer 144 are sequentially formed on the surface of the light-emitting region 110. In FIG. 4B, a permanent substrate 142 is provided and a diffusion barrier layer 143 is formed on the surface of the permanent substrate 142. In FIG. 4C, the reflecting layer 144 is wafer bonded to the diffusion barrier layer 143 at a relatively high temperature, and then, a first electrode 112 is formed on the surface of the n-doped AlGaInP layer 103 and a second electrode 113 is formed on the surface of the permanent substrate 142 after the removal of the temporary substrate 102. Because the light upwardly toward the permanent substrate 142 will be reflected by the reflecting layer 144, thereby the performance of the LED 140 is enhanced.

FIGS. 5A to 5G depict the steps of manufacturing a LED utilizing the wafer-bonding technique disclosed in the U.S. Pat. No. 6,967,117. In FIG. 5A, a single large-size substrate 102 is provided for the EPI process, wherein the substrate 102 is an n-doped GaAs substrate, also referred as a temporary substrate. In FIG. 5B, a light-emitting region 110 is formed on the surface of the substrate 102, and then a buffer layer 145 and a reflecting layer 144 are sequentially formed on the surface of the light-emitting region 110. In FIG. 5C, a permanent substrate 142 is provided and a diffusion barrier layer 143 is formed on the surface of the permanent substrate 142. In FIG. 5D, the diffusion barrier layer 143 is wafer bonded to the reflecting layer 144 at a relatively high temperature. In FIG. 5E, the substrate 102 is removed from the structure of FIG. 5D. In FIG. 5F, a plurality of first electrodes 112 are formed on the surface of the light-emitting region 110 and a second electrode 113 is formed on the surface of the permanent substrate 142. At last, as depicted in FIG. 5G, a plurality of LEDs are manufactured after cutting the structure of FIG. 5F.

Alternatively, after the step depicted in FIG. 5E is completed, an etching procedure can be processed to partially remove the light-emitting region 110. A first electrode 112 and a second electrode 113 are respectively formed on the surface of the n-doped AlGaInP layer 103 and the portion of the p-doped GaP layer 106, and this structure is then cut into a plurality of planar-electrode LEDs as shown in FIG. 6.

In the above-described method, the wafer bonding is processed prior than the removal of the temporary substrate and the formation of the electrodes. However, even the problem resulted in the U.S. Pat. No. 5,502,316, a weak mechanical strength resulted by the removal of the temporary substrate, can be avoided in this method, a low reflectivity, so as reducing the efficiency of the LED is still resulted in due to an alloy procedure during the formation of the first and the second electrodes on the bonded chips. Moreover, the etching procedure processed to the light-emitting region 110 will reduce the surface area of the light-emitting region 110 depicted in FIG. 6, and current cannot uniformly travel through the light-emitting region 110, so as the efficiency of the LED is reduced.

The U.S. Pat. No. 6,221,683 discloses another method of manufacturing a LED. As depicted in FIG. 7A, a light-emitting region 110 is formed on the surface of a temporary substrate (e.g., n-doped GaAs), and the light-emitting region 110 sequentially includes an n-doped AlGaInP layer 103, an AlGaInP active layer 104, a p-doped AlGaInP layer 105, and a p-doped GaP layer 106. Next, a first metallic contacts layer 162 is formed on the surface of the n-doped AlGaInP layer 103 of the light-emitting region 110 after the removal of the temporary substrate. In FIG. 7B, a permanent substrate 166 is provided and on which a second metallic contacts layer 164 is formed. In FIG. 7C, a solder layer 163 is provided between the first metallic contacts 162 and the second metallic contacts 164, and the first metallic contacts 162 is wafer bounded to the second metallic contacts 164. Then, a first electrode 170 is formed on the surface of the p-doped GaP layer 106 and a second electrode 172 is formed on the surface of the permanent substrate 166, wherein the formation of the first electrode 170 and the second electrode 172 is not necessary after the wafer bonding step.

FIGS. 8A to 8G depict the steps of manufacturing a LED utilizing the wafer-bonding technique disclosed in the U.S. Pat. No. 6,221,683. In FIG. 8A, a single large-size substrate 102 is provided for the EPI process, wherein the substrate 102 is an n-doped GaAs substrate, also referred as a temporary substrate. In FIG. 8B, a light-emitting region 110 is formed on the surface of the temporary substrate 102. In FIG. 8C, a plurality of first metallic contact layers 162 are formed on the surface of the light-emitting-region 110 after the removal of the temporary substrate 102. In FIG. 8D, a permanent substrate 166 is provided and a plurality of second metallic contact layers 164 is formed on the surface of the permanent substrate 166. In FIG. 8E, a solder layer 163 is provided between the first metallic contact layers 162 and the second metallic contact layers 164, and the second metallic contact layers 164 are wafer bounded to the first metallic contact layers 162. In FIG. 8F, a plurality of first electrodes 170 are formed on the surface of the light-emitting region 110 and a second electrode 172 is formed on the surface of the permanent substrate 166. At last, FIG. 8G depicts that a plurality of LEDs are manufactured after cutting the above-described structure in FIG. 8F.

Similarly, the above-mentioned problems, including that the light-emitting region 110 is difficult to handle without breaking after the removal of the temporary substrate and the efficiency of the LED degrades during the alloy procedure, still occur.

SUMMARY OF THE INVENTION

There, the present invention provides a chip-bonding LED having a permanent substrate partially overlapped by a light-emitting region of the chips, and the chip-bonding LED has a better efficiency.

The present invention discloses a method of manufacturing a LED, comprising steps of: providing a temporary substrate; forming a light-emitting region on the surface of the temporary substrate; sequentially forming a plurality of ohmic contact dots, a reflecting layer, a barrier layer, and an eutectic layer on a first surface of the light-emitting region; cutting the resulting structure into a plurality of chips, wherein each chip includes at least a portion of the temporary substrate, a portion of the light-emitting region, a portion of the ohmic contact dots, a portion of the reflecting layer, a portion of the barrier layer, and a portion of the eutectic layer; providing a permanent substrate, wherein a first surface of the permanent substrate is greater than the bonded surface of the chips; forming a metal layer on the first surface of the permanent substrate; bonding the eutectic layer of the chip to the metal layer utilizing a chip-bonding technique; removing the temporary substrate of the chip; and forming a first electrode which is contacted to a second surface of the light-emitting region.

Moreover, the present invention further discloses a method of manufacturing a LED, comprising steps of: providing a temporary substrate; forming a light-emitting region on the surface of the temporary substrate; sequentially forming a plurality of ohmic contact dots, a reflecting layer, a barrier layer, and a eutectic layer on a first surface of the light-emitting region; cutting the resulting structure into a plurality of chips, wherein each chip includes at least a portion of the temporary substrate, a portion of the light-emitting region, a portion of ohmic contact dots, a portion of the reflecting layer, a portion of the barrier layer, and a portion of the eutectic layer; providing a permanent substrate and etching a first surface of the permanent substrate to form a plurality of fillisters, wherein a top area of each fillister is larger than a bottom area of each fillister; defining the fillister is a chip holding space after sequentially forming an insulating layer and a metal layer on the first surface of the permanent substrate, wherein the metal layer is divided to a first area and a second area, and these two areas are not contacted to each other; bonding the eutectic layer of the chip to the first area of the metal layer in the chip holding space utilizing a chip-bonding technique; removing the temporary substrate of the chip; providing a filler structure between the chip holding space and the chip; and forming a first electrode which is contacted to a second surface of the light-emitting region and the second area of the metal layer.

Moreover, the present invention further discloses a LED, including: a permanent substrate having a first surface; a metal layer formed on the first surface of the permanent substrate, and the metal layer is divided to a first area and a second area; and a chip placed on the second area of the metal layer; wherein the chip at least includes a first electrode and a light-emitting region, and the chip is bonded to the second area of the metal layer utilizing a chip-bonding technique to make a electric connection between the metal layer and the light-emitting region, and the thickness of the light-emitting region is between 30 um~10 um.

Moreover, the present invention further discloses a LED, including: a permanent substrate having a first surface with a chip hold space, and the first surface and the chip holding space both having an insulating layer and a metal layer, wherein the metal layer is divided to a first area and a second area, and these two areas are not contacted to each other; a chip having a first surface, wherein the first surface is bonded to the bottom of the chip holding space, and the first surface is contacted to the first area of the metal layer but not contacted to the second area of the metal layer; a filler structure filled between the chip and the chip holding space; and a first electrode contacted to a second surface of the chip; wherein the chip at least includes a light-emitting region, and the chip is bonded to the first area of the metal layer utilizing a chip-bonding technique to make a electric connection between the metal layer and the light-emitting region.

BRIEF DESCRIPTION OF THE DRAWINGS

The above contents of the present invention will become more readily apparent to those ordinarily skilled in the art after reviewing the following detailed description and accompanying drawings, in which:

FIGS. 10A to 10H show steps of manufacturing the LED of FIG. 9 utilizing a chip-bonding technique according to the first embodiment of the present invention;

FIGS. 12A to 12G show steps of manufacturing the LED of FIG. 11 utilizing the chip-bonding technique according to the second embodiment of the present invention.

DETAILED DESCRIPTION OF PREFERRED EMBODIMENTS

Figure 1:
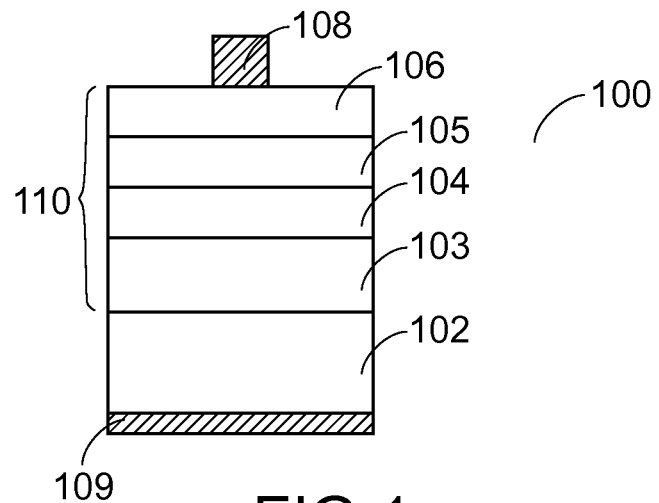
FIG. 1 (prior art) is a cross-sectional diagram of an AlGaInP quaternary LED in the prior art.
Figure 2:
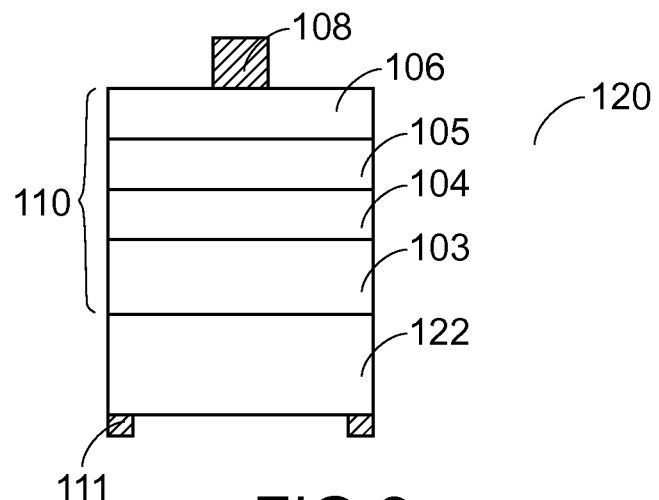
FIG. 2 (prior art) is a cross-sectional diagram of another AlGaInP quaternary LED in the prior art.
Figure 3A:
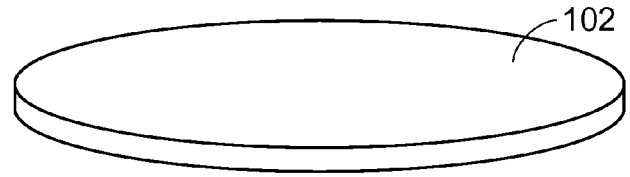
FIGS. 3A to 3F (prior art) show the steps of manufacturing the LED of FIG. 2 utilizing a wafer-bonding technique in the prior art.
Figure 3B:
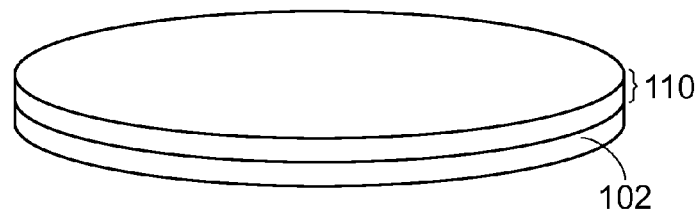
Figure 3C:
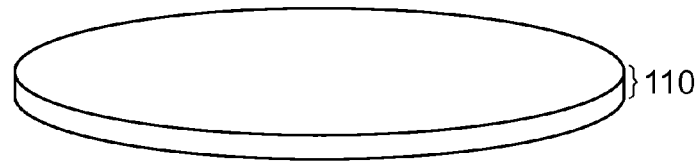
Figure 3D:
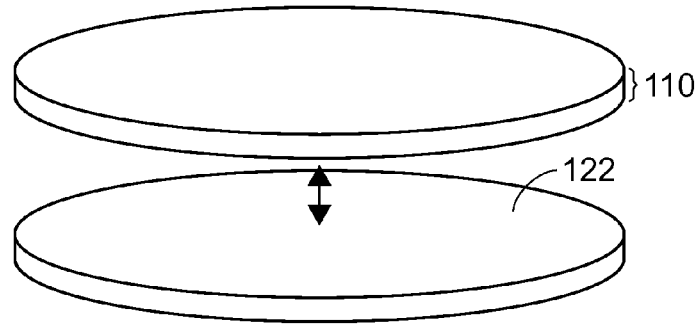
Figure 3E:
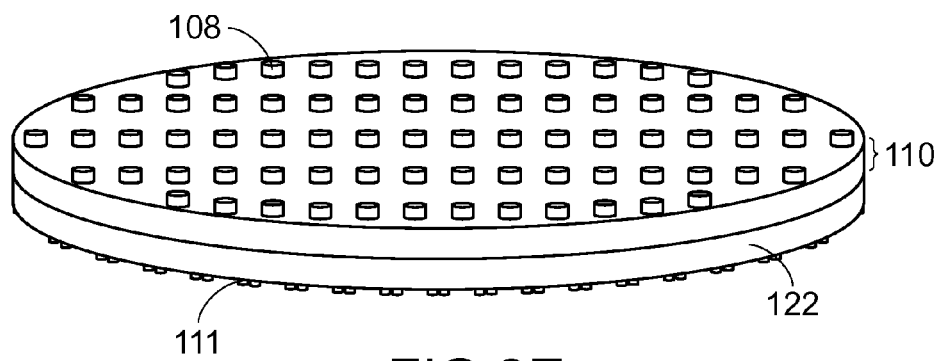
Figure 3F:
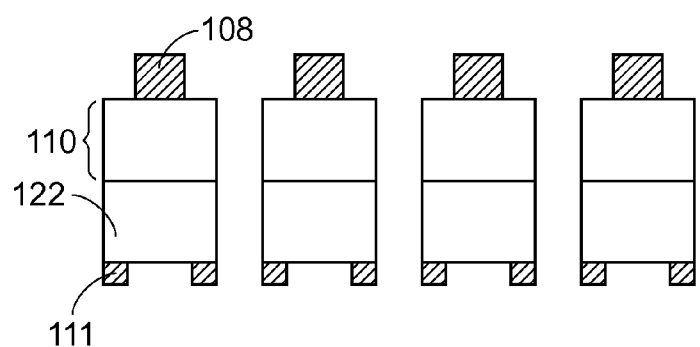
Figure 4A:
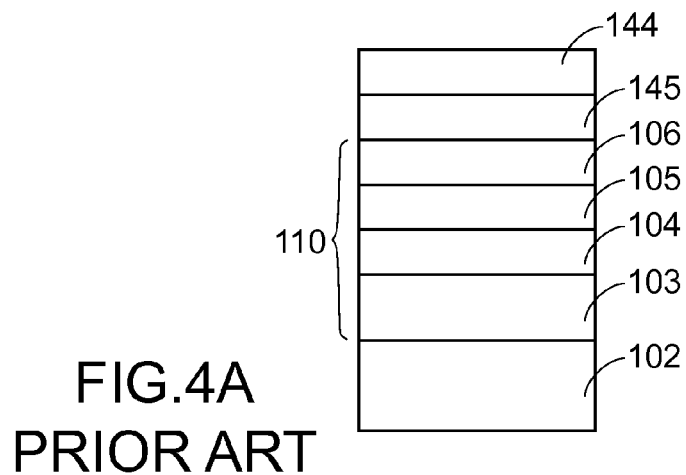
FIGS. 4A to 4C (prior art) show the process of manufacturing a LED having a reflecting layer in the prior art.
Figure 4B:
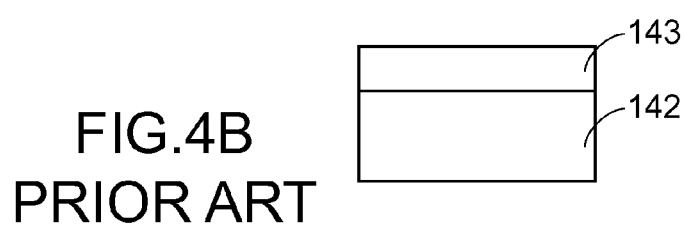
Figure 4C:
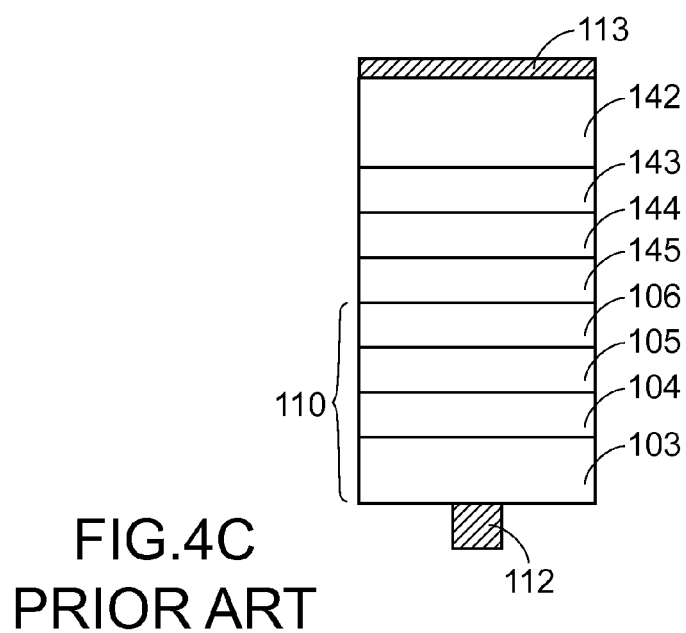
Figure 5A:
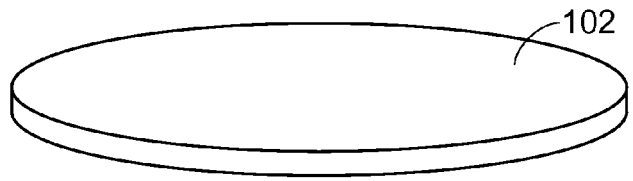
FIGS. 5A to 5G (prior art) show steps of manufacturing the LED of FIG. 4 utilizing the wafer-bonding technique.
Figure 5B:
Figure 5C:
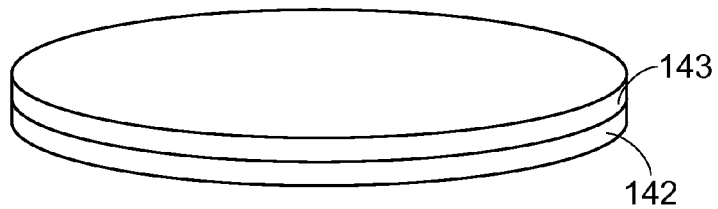
Figure 5D:
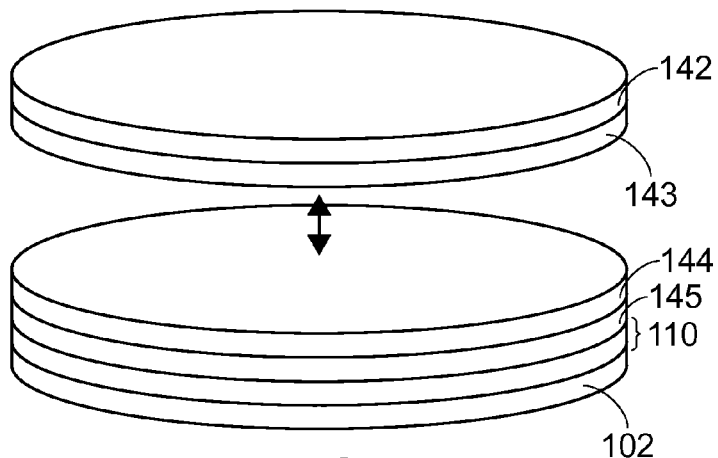
Figure 5E:
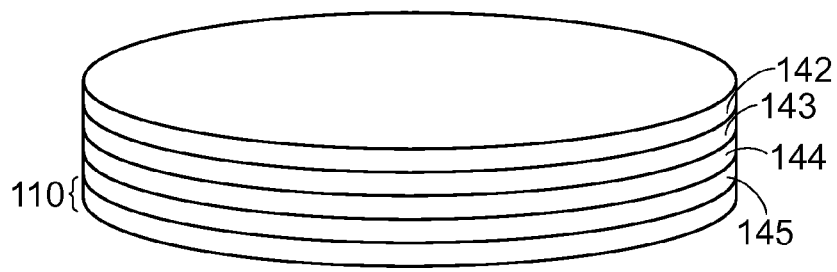
Figure 5F:
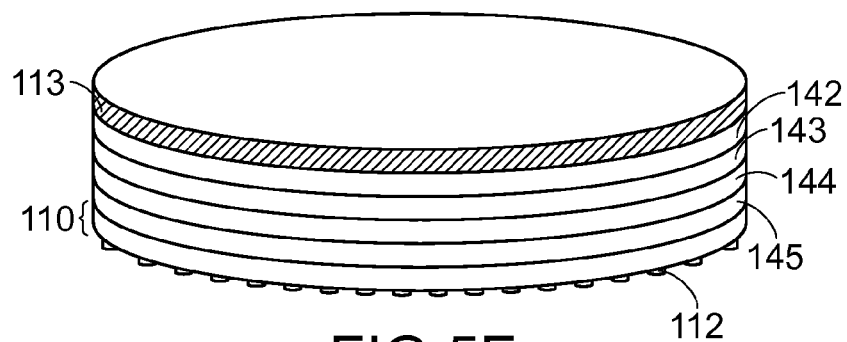
Figure 5G:
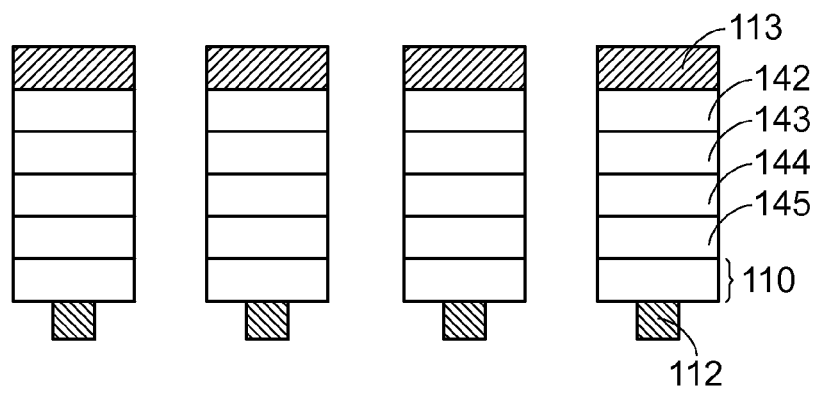
Figure 6:
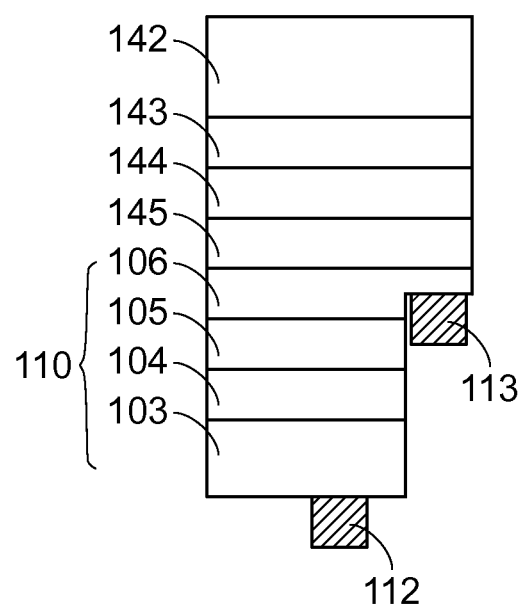
FIG. 6 (prior art) is a cross-sectional diagram of another LED having a reflecting layer in the prior art.
Figure 7A:
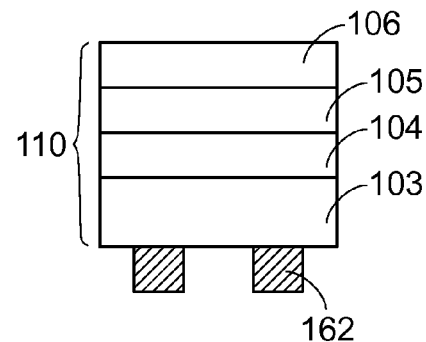
FIGS. 7A to 7C (prior art) show the process of manufacturing a LED having a solder layer in the prior art.
Figure 7B:
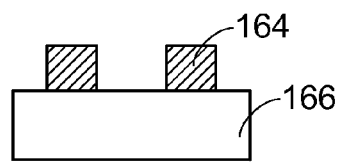
Figure 7C:
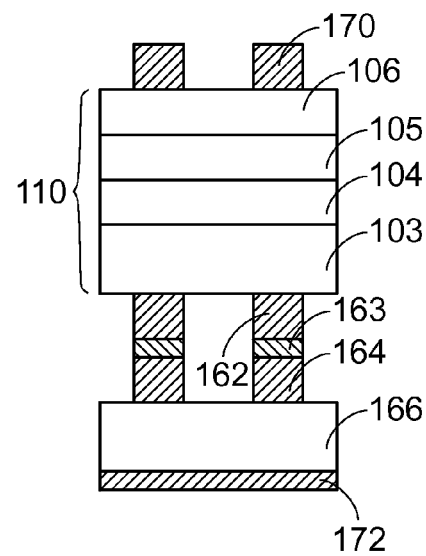
Figure 8A:
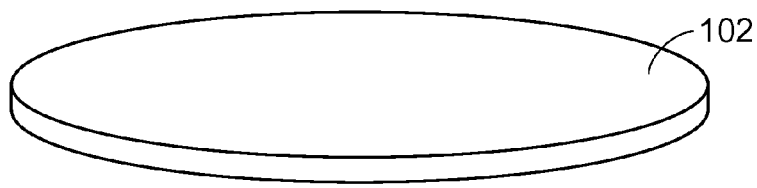
FIGS. 8A to 8G (prior art) show the steps of manufacturing the LED of FIG. 7 utilizing the wafer-bonding technique.
Figure 8B:
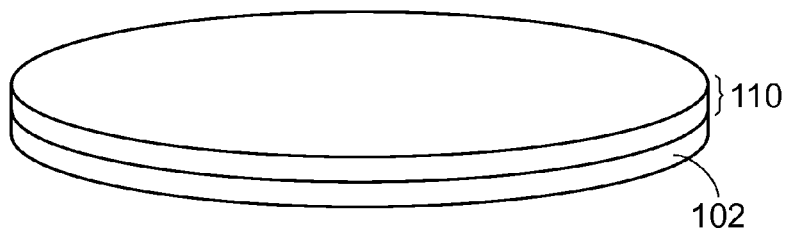
Figure 8C:
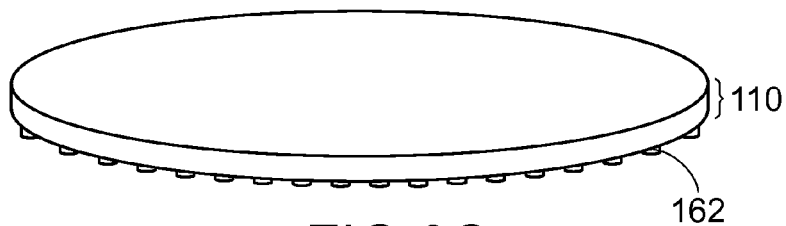
Figure 8D:
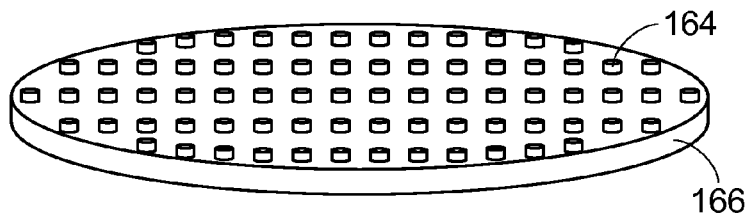
Figure 8E:
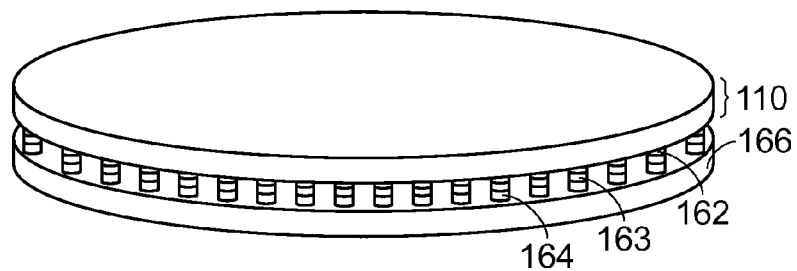
Figure 8F:
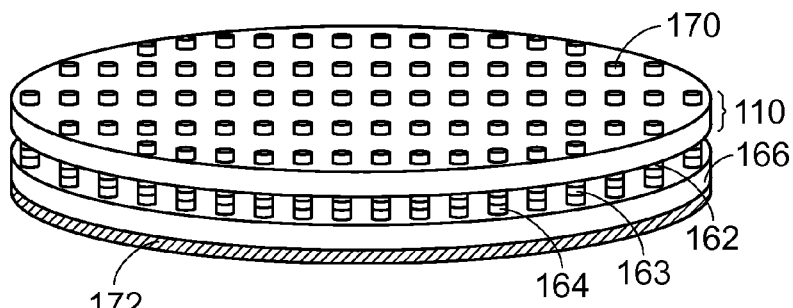
Figure 8G:
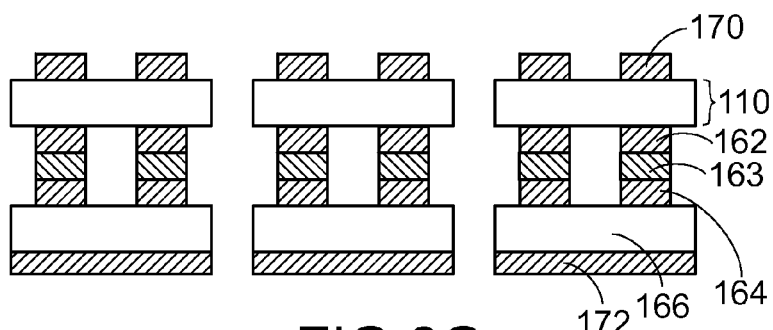
Figure 9:
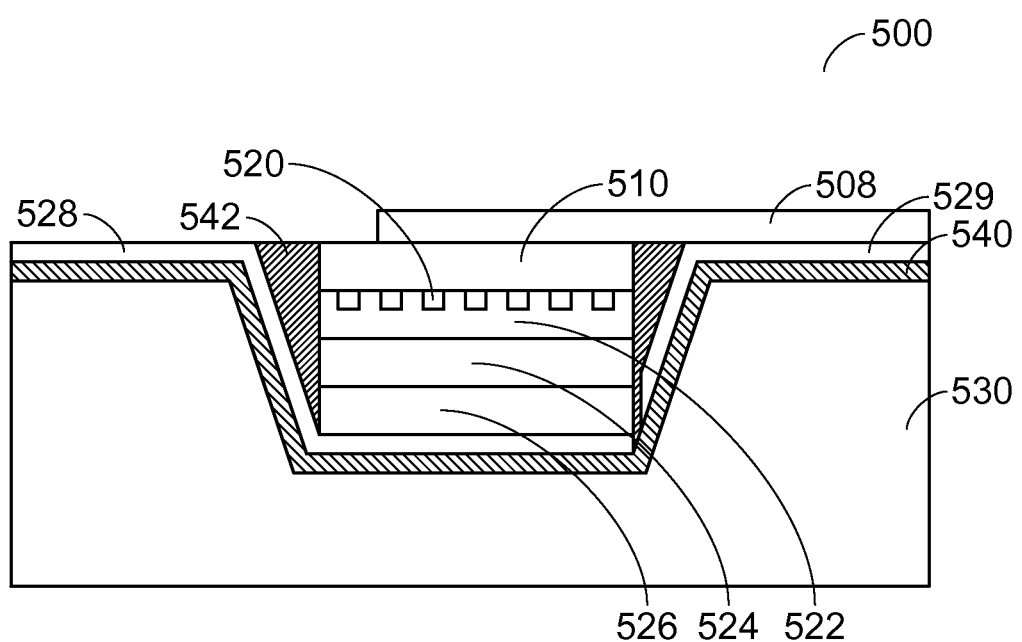
FIG. 9 is a cross-sectional diagram showing a chip-bonding LED according to the first embodiment of the present invention.

The present invention discloses a chip-bonding LED for fixing the defects of the conventional LED that is manufactured utilizing the wafer-bonding technique. FIG. 9 is a cross-sectional diagram showing the structure of the chip-bonding LED of the first embodiment of the present invention. The chip-bonding LED 500 includes a first electrode 508, a light-emitting region 510, a plurality of ohmic contact dots 520, a reflecting layer 522, a barrier layer 524, a eutectic layer 526, a filler structure 542, a first metal layer 528, a second metal layer 529, an insulating layer 540, and a permanent substrate 530 having a chip holding space. The first metal layer 528 is served as a second electrode. The filler structure 542 is Polyimide, and the filler structure 542 is filled the chip holding space after the chip bonding step.

In the first embodiment of the present invention, a large-size Si substrate 530 is provided and served as the permanent substrate, and then the chip holding space is formed on the surface of the permanent substrate 530 after an etching procedure is processed to the permanent substrate 530. After the chip is loaded in the chip holding space, the chip is alloyed to the chip holding space. After the alloy procedure is processed, the temporary substrate is then removed and the electrode is formed, so as the chip-bonding LED of the first embodiment of the present invention is manufactured.

Figure 10A:
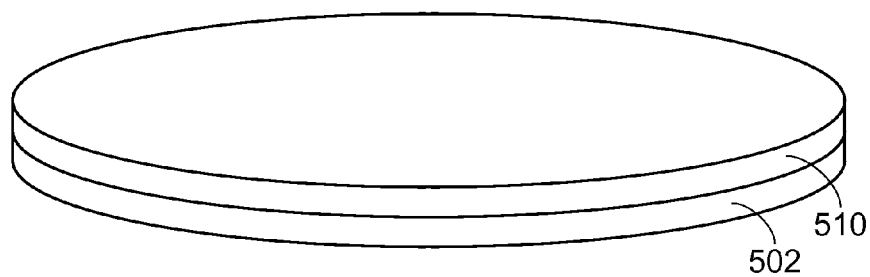

FIGS. 10A to 10G depict the steps of manufacturing the chip-bonding LED in the first embodiment of the present invention. In FIG. 10A, an n-doped GaAs temporary substrate 502 is provided and on which a light-emitting region 510 is formed. The light-emitting region 510 at least includes an n-doped GaAs layer, an n-doped AlGaInP layer, an AlGaInP active layer, a p-doped AlGaInP layer, and a p-doped GaP layer arranged in the listed order. Typically, the AlGaInP active layer is a double-heterostructure active layer or a quantum-well active layer. It is understood that the structure of the light-emitting region 510 may vary in configurations according to different requirements. It is intended not to limit the structure of the light-emitting region 510 in the first embodiment of the present invention.

Figure 10B:
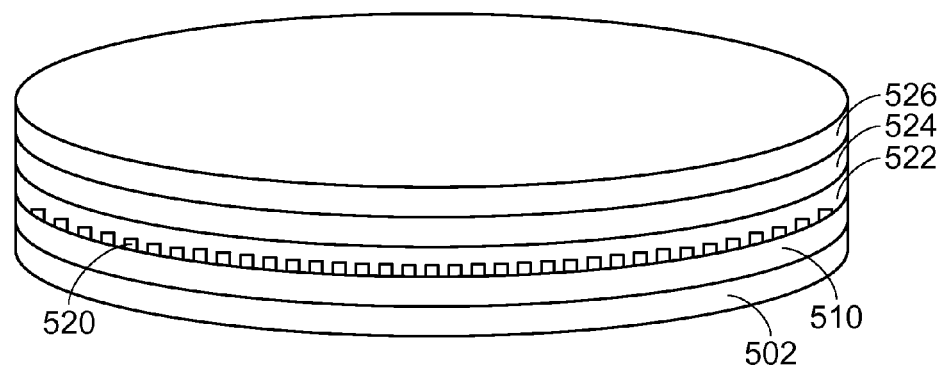

In FIG. 10B, a plurality of ohmic contact dots 520, a reflecting layer 522, a barrier layer 524, and a eutectic layer 526 are sequentially formed on the surface of the p-doped AlGaInP layer of the light-emitting region 510. In the first embodiment of the present invention, the material of the ohmic contact dot 520 is made of Be/Au or Zn/Au alloy. The reflecting layer 522 is made of a metal having a high reflectivity (e.g., Au, Al or Ag), or a combination of ITO layer (Indium Tin Oxide) and a metal having a high reflectivity. The ITO layer can serve as a reflecting layer due to different refractive indexes of the ITO layer and the LED. Additionally, the ITO layer can also avoid an inter-diffusion between the metal layer and the LED, so as to keep the reflectivity of the metal layer. The barrier layer 524 is made of one selected from a group consisting of Au, Al, Ag, or ITO layer having a high stability and a high melting point. The eutectic layer 526 is made of Sn, Sn/Au, Sn/In, Au/In, or Sn/Ag alloy having a melting point around 300☐.

Figure 10C:
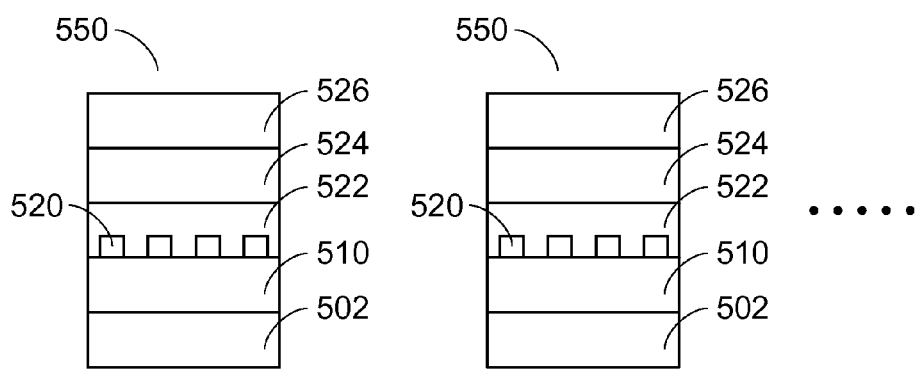

In FIG. 10C, a plurality of chips 550 are manufactured after cutting the above-described structure of FIG. 10B, and each chip 550 includes the temporary substrate 502, the light-emitting region 510, a plurality of ohmic contact dots 520, the reflecting layer 522, the barrier layer 524, and the eutectic layer 526.

Figure 10D:
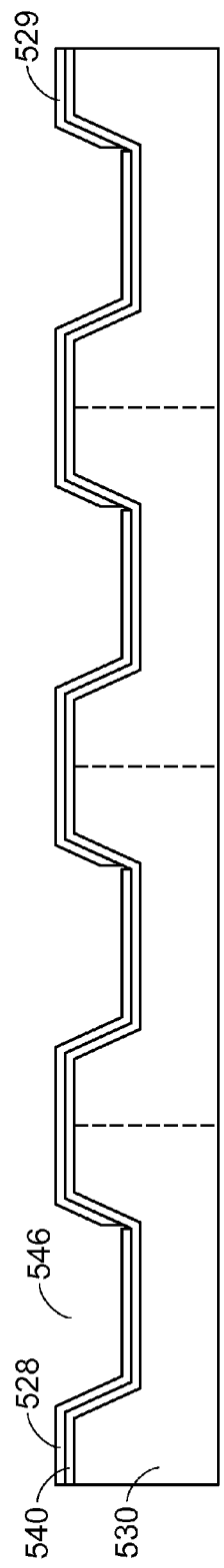

In FIG. 10D, a large-size Si permanent substrate 530 is provided, and a plurality of fillisters are formed after the etching procedure is processed on the surface of the permanent substrate 530, wherein the top area of the fillister is larger than the bottom area of the fillister. Next, an insulting layer 540, a first metal layer 528, and a second metal layer 529 are sequentially formed on the surface of the permanent substrate 530, so as the chip holding space 546 is formed. The first metal layer 528 and the second metal layer 529 are both formed on the insulting layer 540 but not being contacted to each other. That means both the first metal layer 528 and the second metal layer 529 are contained on each individual permanent substrate 530 after the structure of the permanent substrate 530 is cut (dot line). As depicted in FIG. 10D, there is a gap between the first metal layer 528 and the second metal layer 529, and the gap is formed on one side of the bottom of the chip holding space 546.

Figure 10E:
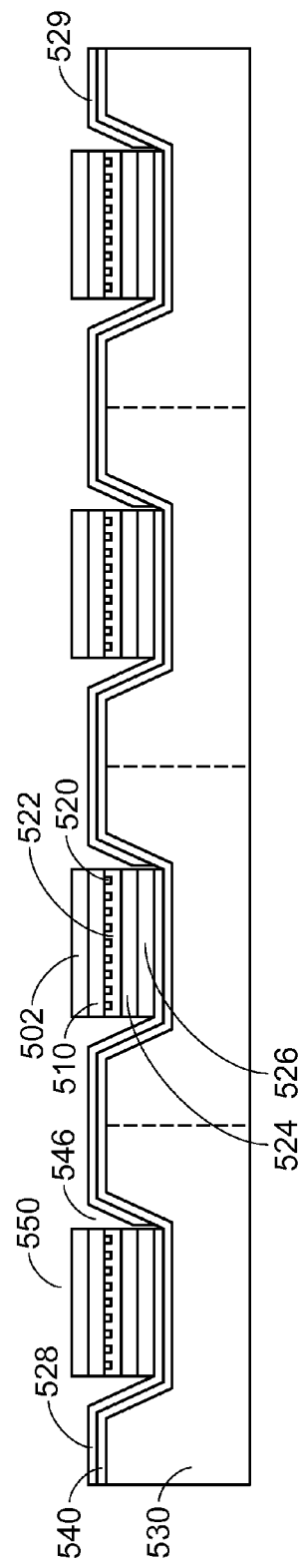

In FIG. 10E, each chip holding space 546 is loaded with a chip 550, and the eutectic layer 526 of the chip 550 is attached with the first metal layer 528. When all the chips 550 are loaded in the chip holding space 546, the alloy procedure is processed at a relatively low temperature (e.g., 300☐), which means the eutectic layer 526 of the chip 550 is alloyed to the first metal layer 528. In the first embodiment of the present invention, the bottom area of the chip holding space 546 is designed to equal, or greater, than the cross-sectional area of the chip 550, so as the chip 550 can slip and align to the bottom of the chip holding space 546 successfully due to the top area of the chip holding space 546 is greater than the cross-sectional area of the chip 550.

In FIG. 10F, the temporary substrate 502 is removed utilizing a mechanical-polishing procedure or a chemical-etching procedure. A filler structure 542 is then formed via an insulating filler material filled in the gap between the chip 550 and the chip holding space 546. Then the first electrode 508 is formed on the surface of the n-doped AlGaInP layer of the light-emitting layer 510. In the first embodiment, the first electrode 508 is contacted to the second metal layer 529, and the filler material is Polyimide.

Figure 10H:
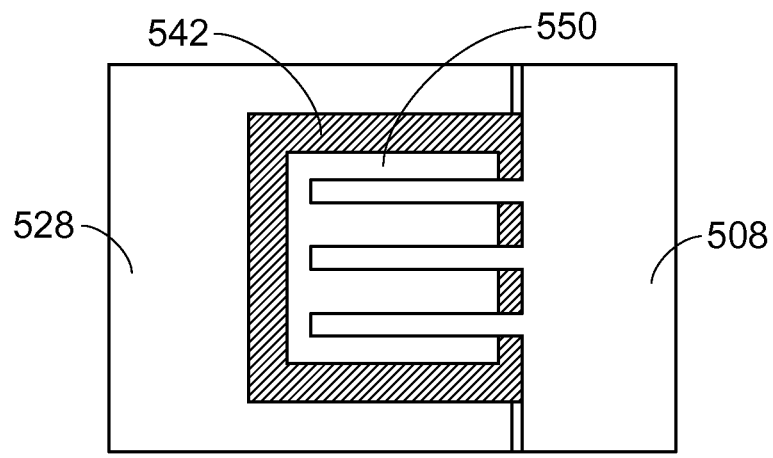

In FIG. 10G, a plurality of chip-bonding LEDs are manufactured after cutting the permanent substrate 530 of the structure depicted in FIG. 10F. FIG. 10H is the front-view diagram of the chip-bonding LED.

In the first embodiment of the present invention, the first metal layer 528 serves as a second electrode due to the first metal layer 528 is alloyed to the eutectic layer 526 of the chip 550. Additionally, because the first electrode 508 is contacted to the second metal layer 529 and both the first metal layer 528 (second electrode) and the first electrode 508 are not within the chip 550, the bonding wires can be directly bonded to the first metal layer 528 (second electrode) and the first electrode 508 without damaging the chip 550. Moreover, the first metal layer 528 and the second metal layer 529 can also function for reflecting the light, generated by the light-emitting region 510, out the LED, so as the performance of the LED is enhanced.

In the first embodiment of the present invention, the alloy procedure is processed prior than the removal of the temporary substrate 502, so as the light-emitting region 510 in chip 550 can be relatively thin (e.g., 30 um~10 um), and the cost of the EPI process can be down. Moreover, the chip broken resulted in the alloy procedure can be avoided due to the chip 550 is cut first, and then placed in the chip holding space 546, so as the Yield of the LEDs is almost to 100%. In addition, the alloy procedure between the chip 550 and the substrate of the first embodiment of the present invention can be processed at a relatively low temperature without degrading the performance of the chips. The alloy temperature is under temperature 300□ if the eutectic layer is made of Sn/Au having ratio of 20/80 (Sn20Au80).

Figure 11:
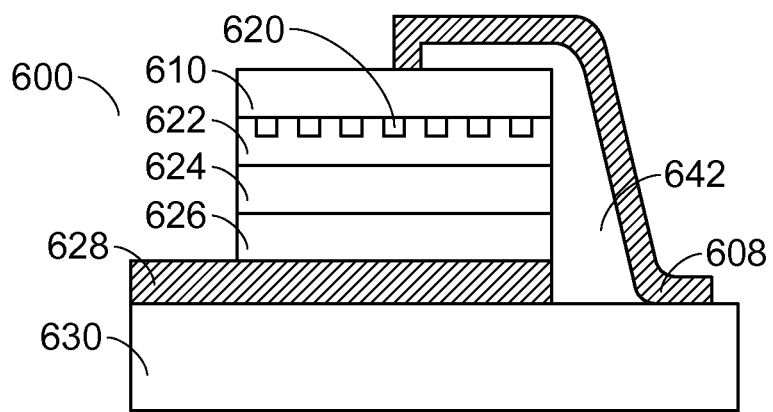
FIG. 11 is a cross-sectional diagram showing a chip-bonding LED according to the second embodiment of the present invention.

FIG. 11 is a cross-sectional diagram showing the structure of the chip-bonding LED of the second embodiment of the present invention. The chip-bonding LED 600 includes a first electrode 608, a light-emitting region 610, a plurality of ohmic contact dots 620, a reflecting layer 622, a barrier layer 624, a eutectic layer 626, an insulating structure 642, a metal layer 628, and a large-size permanent substrate 630, which is not electrically conductive. In the chip-bonding LED 600, the metal layer 628 serves as a second electrode and the insulating structure 642 is Polyimide. The large-size permanent substrate 630 is selected from a group consisting a $SiO_2$ on Si substrate, an AlN substrate, a glass substrate, or a quartz substrate.

Figure 12A:
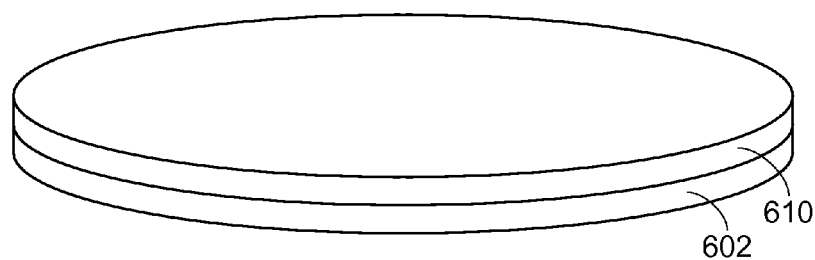

FIGS. 12A to 12G depict the steps of manufacturing the chip-bonding LEDs depicted in FIG. 11 of the second embodiment. In FIG. 12A, an n-doped GaAs temporary substrate 602 is provided and on which a light-emitting region 610 is grown. The light-emitting region 610 at least includes an n-doped GaAs layer, an n-doped AlGaInP layer, an AlGaInP active layer, a p-doped AlGaInP layer, and a p-doped GaP layer arranged in the listed order. Typically, the AlGaInP active layer is a double-heterostructure active layer or a quantum-well active layer. It is understood that the structure of the light-emitting region 610 may vary in configurations according to different requirements. It is intended not to limit the structure of the light-emitting region 610 in the second embodiment of the present invention.

Figure 12B:
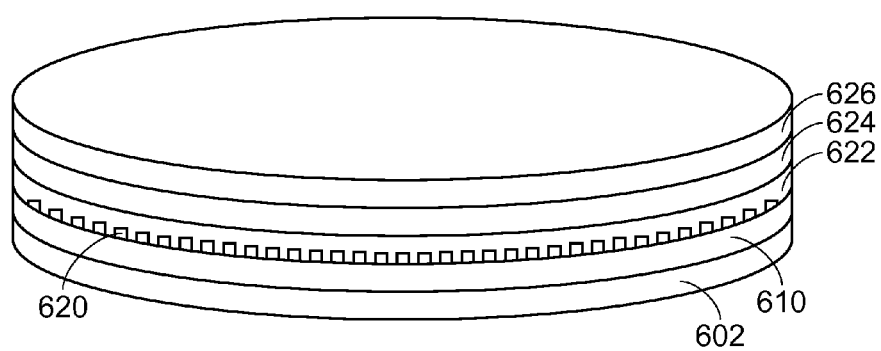

In FIG. 12B, a plurality of ohmic contact dots 620, a reflecting layer 622, a barrier layer 624, and a eutectic layer 626 are sequentially formed on the p-doped AlGaInP layer of the light-emitting region 610. In the second embodiment of the present invention, the material of the ohmic contact dot 620 is made of Be/Au or Zn/Au alloy, the reflecting layer 622 is made of a metal having a high reflectivity (e.g., Au, Al or Ag), or a combination of ITO layer (Indium Tin Oxide) and a metal having a high reflectivity. The ITO layer can serve as a reflecting layer due to different refractive indexes of the ITO layer and the LED. Additionally, the ITO layer can also avoid an inter-diffusion between the metal layer and the LED, so as to keep the reflectivity of the metal layer. The barrier layer 624 is made of Pt, Ni, W, or ITO having a high stability and a high melting point. The eutectic layer 626 is made of Sn, Sn/Au, Sn/In, Au/In, or Sn/Ag alloy having a melting point around 300□.

Figure 12C:
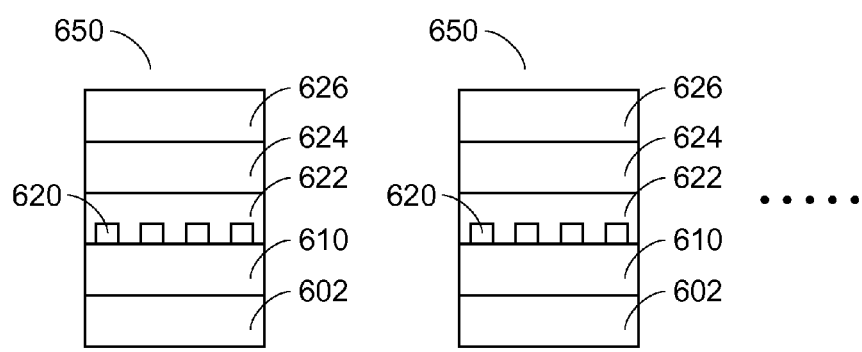

In FIG. 12C, a plurality of chips 650 are manufactured after cutting the above-described structure in FIG. 12B, and each chip 650 includes the temporary substrate 602, the light-emitting region 610, a plurality of ohmic contact dots 620, the reflecting layer 622, the barrier layer 624, and the eutectic layer 626.

In FIG. 12D, a large-size permanent substrate 630 is provided, and on which a plurality of metal layers 628 are formed, wherein the surface area of each individual metal layer 628 is greater than the contacted surface of the chip 650.

In FIG. 12E, each chip 650 is placed on the surface of the metal layer 628, and the eutectic layer 626 of the chip 650 is attached with a portion of the metal layer 628, which means the surface area of the metal layer 628 not attached with the chip 650 can serve as a second electrode. When all the chips 650 are placed on the surface of the metal layer 628, the eutectic layer 626 of the chip 650 is alloyed to the metal layer 628 utilizing the alloy procedure at a relative low temperature (e.g., below 300□).

Figure 12F:
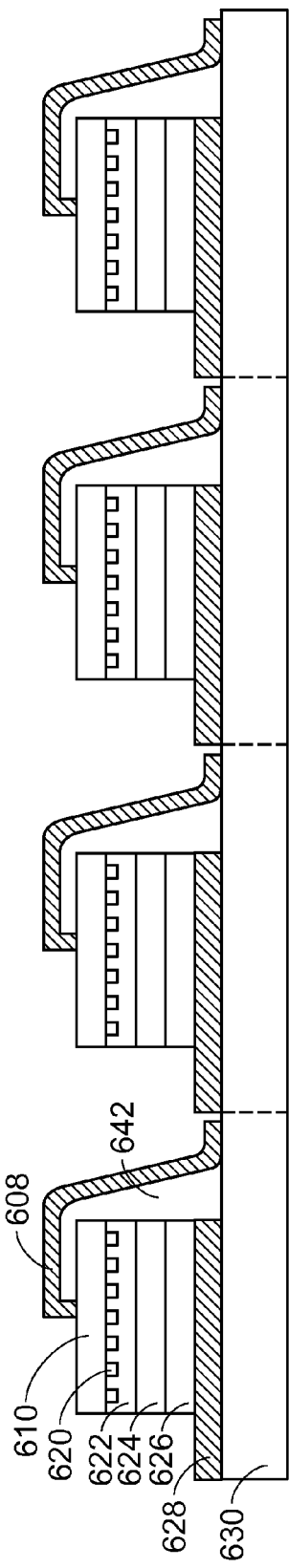

In FIG. 12F, the temporary substrate 602 is removed utilizing a mechanical-polishing procedure or a chemical-etching procedure. An insulating structure 642 is then formed on one side of the chip 650. Then a first electrode 608 is formed on the n-doped AlGaInP layer of the light-emitting layer 610, wherein the first electrode 608 is covered all the insulating structure 642 and partially covered the permanent substrate 630.

Figure 12G:
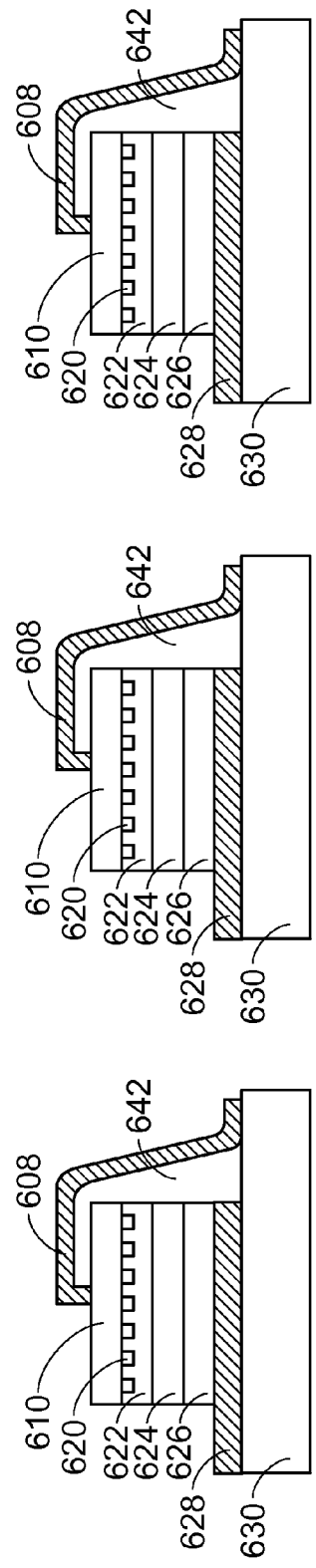

In FIG. 12G, a plurality of chip-bonding LEDs are manufactured after cutting the permanent substrate 630 of the structure depicted in FIG. 12F, wherein the surface area of the permanent substrate 630 is greater than the cross-sectional area of the chip 650.

In the second embodiment of the present invention, the first metal layer 628 is served as a second electrode due to the metal layer 628 is alloyed to the eutectic layer 626. Additionally, because the first electrode 608 is covered on the permanent substrate 630 and both the first metal layer 628 (second electrode) and the first electrode 608 are not within the chip 650, the bonding wires can be directly bonded to the first metal layer 628 (second electrode) and the first electrode 608 without damaging the chip 650.

Moreover, the alloy procedure is processed prior than the removal of the temporary substrate 602, so as the light-emitting region 610 in chip 650 can be relatively thin (e.g., 30 um~10 um), and the cost of the EPI process can be down. Moreover, the chip broken resulted in the alloy procedure can be avoided due to the chip 650 is cut first, and then placed on the metal layer 628, so as the Yield of the LEDs is almost to 100%. In addition, the alloy procedure between the chips and the substrate of the second embodiment of the present invention can be processed at a relatively low temperature without degrading the performance of the chips. The alloy temperature is under temperature 300□ if the eutectic layer is made of Sn/Au having ratio of 20/80 (Sn20Au80).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for manufacturing a LED, comprising steps of:
    providing a temporary substrate;
    forming a light-emitting region on the surface of the temporary substrate;
    forming at least an eutectic layer above a first surface of the light-emitting region;
    cutting the resulting structure into a plurality of dies, wherein a first die of the dies includes a portion of the temporary substrate, a portion of the light-emitting region, and a portion of the eutectic layer;
    providing a permanent substrate having a holding space on top of the permanent substrate;
    forming an insulating layer on to of the permanent substrate and covering the holding space;
    forming a first metal layer on to of the insulating layer;
    forming a second metal layer on to of the insulating layer;
    bonding the first die to the first metal layer within the holding space via the eutectic layer coupling to the first metal layer;
    forming a filler structure filled between the first die and the holding space;
    removing the temporary substrate of the first die; and
    forming a first electrode on to of the first die, in contact with the light-emitting region and above the filler structure, and above and contacting the second metal layer, wherein the first electrode is extended to outside of the holding space;
    wherein a portion of a surface of the light-emitting region is exposed from the filler structure and the first electrode, and the second metal layer is formed between the first electrode and the insulating layer.

2. The method according to claim 1, wherein the permanent substrate is selected from a group consisting a $SiO_2$ on Si substrate, an AlN substrate, a glass substrate, or a quartz substrate and the temporary substrate is an n-doped GaAs substrate.

3. The method according to claim 1, further comprising a plurality of ohmic contact dots, a reflecting layer and a barrier layer formed between the light-emitting region and the eutectic layer; wherein the material of the ohmic contact dots includes a Be/Au or Zn/Au alloy; the reflecting layer is made of one selected from a group consisting of Au, Al, Ag, or a combination of Indium Tin Oxide and a metal having a high reflectivity; the barrier layer is made of one selected from a group consisting Pt, Ni, W, and Indium Tin Oxide; or the eutectic layer is made of one of Sn/Au or Sn/Ag alloy.

4. The method according to claim 1, wherein the light-emitting region includes:
    an n-doped AlGaInP layer;
    an AlGaInP active layer grown on the n-doped AlGaInP layer;
    a p-doped AlGaInP layer grown on the AlGaInP active layer; and
    a p-doped GaP layer grown on the p-doped AlGaInP layer.

5. The method according to claim 4, wherein the AlGaInP active layer is a double-heterostructure active layer or a quantum-well active layer and the thickness of the light-emitting region is between 30um~10um.

6. The method according to claim 1, wherein the material of the filler structure is Polyimide and the bottom area of the holding space is equal, or greater, than the cross-sectional area of the first die.

* * * * *